United States Patent [19]
Masuoka et al.

[11] Patent Number: 5,488,330
[45] Date of Patent: Jan. 30, 1996

[54] BIAS CIRCUIT FOR CONTROLLING BIAS VOLTAGE OF DIFFERENTIAL AMPLIFIER

[75] Inventors: Hideaki Masuoka, Yokohama; Akio Kuroda, Atsugi, both of Japan

[73] Assignee: Kabushiki Kaisha Toshiba, Kawasaki, Japan

[21] Appl. No.: 361,583

[22] Filed: Dec. 22, 1994

[30]     Foreign Application Priority Data

Dec. 22, 1993   [JP]   Japan .................................. 5-323480

[51] Int. Cl.$^6$ ............................... H03F 3/45; H04B 1/26
[52] U.S. Cl. ............................................. 330/261; 455/333
[58] Field of Search .................................. 330/252, 254, 330/261, 292; 327/116, 119; 455/333, 326

[56]          References Cited

U.S. PATENT DOCUMENTS

| | | | |
|---|---|---|---|
| 4,052,626 | 10/1977 | Tuma et al. | 327/116 |
| 4,216,431 | 8/1980 | Shibata et al. | 455/333 |
| 4,560,955 | 12/1985 | Sauer | 330/252 X |
| 4,634,995 | 1/1987 | Nakagawa et al. | 330/261 |

*Primary Examiner*—Steven Mottola
*Attorney, Agent, or Firm*—Oblon, Spivak, McClelland, Maier, & Neustadt

[57]          ABSTRACT

A first differential amplifier includes first and second transistors. A bias circuit includes a second differential amplifier, a constant-current source, and a capacitor. The bases of third and fourth transistors constituting a second differential amplifier, are connected to those of the first and second transistors, respectively. The constant-current source supplies a constant current to the third and fourth transistors, and one end of the capacitor is connected to a connection node of the constant-current source and fourth transistor. In the bias circuit, when a high-level signal is supplied to the base of the first transistor, the capacitor is charged and discharged in accordance with the operations of the third and fourth transistors, with the result that the base potential of the first and second transistors is stabilized, and the operation current flowing through the first differential amplifier is prevented from increasing.

15 Claims, 5 Drawing Sheets

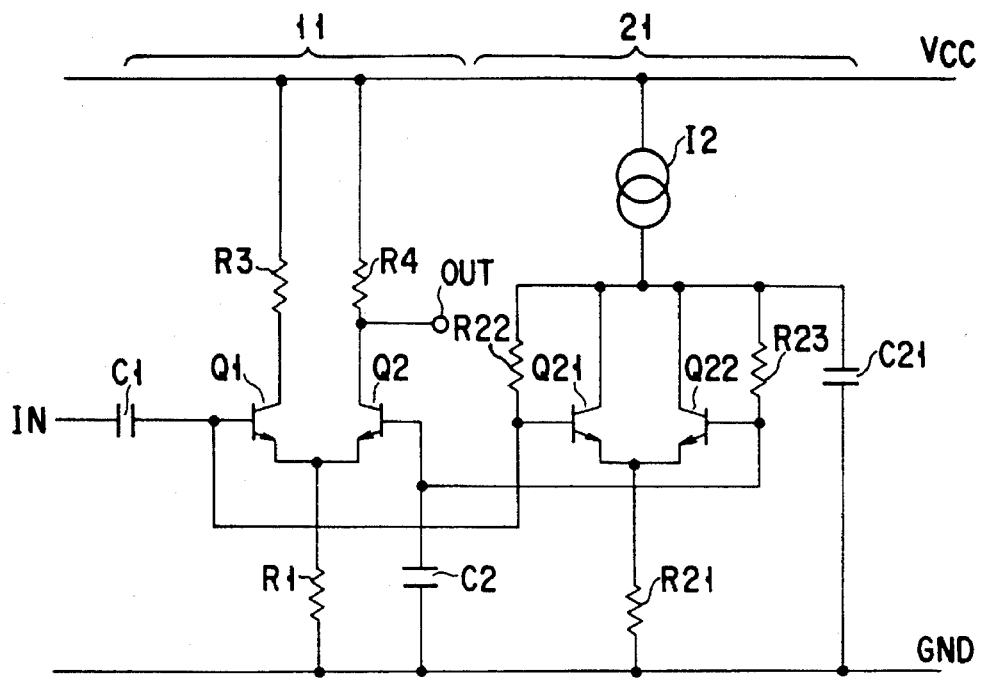
F I G. 1
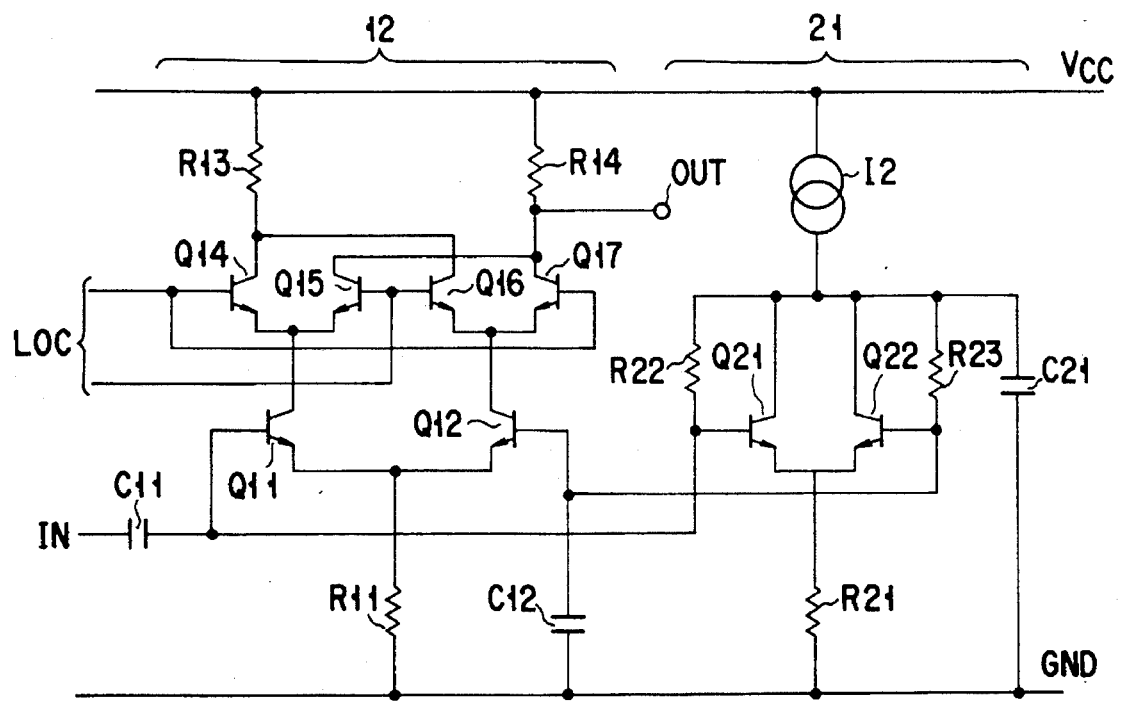
F I G. 2

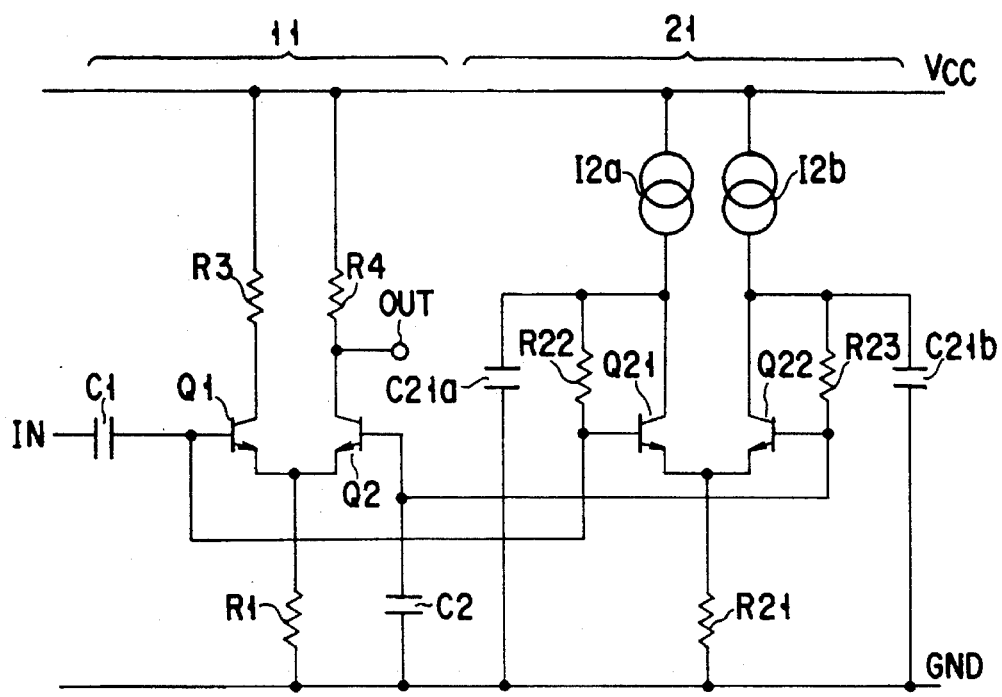
F I G. 3
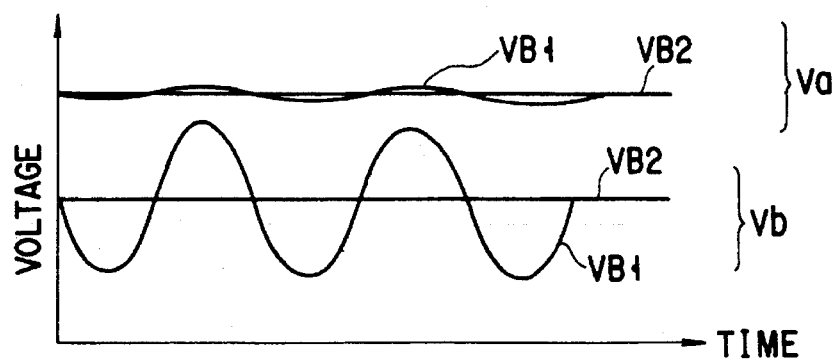
F I G. 4A
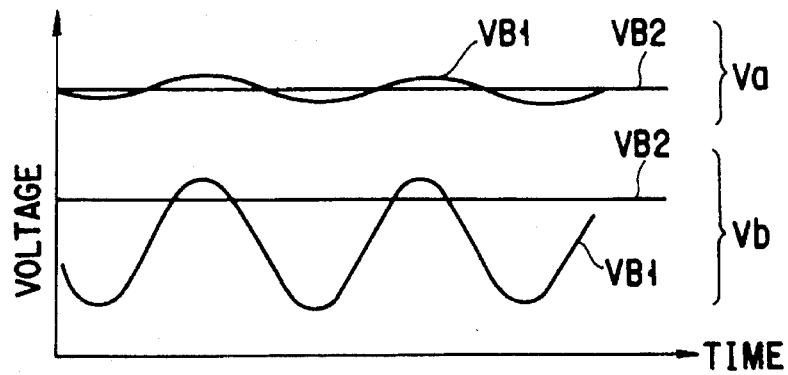
F I G. 4B

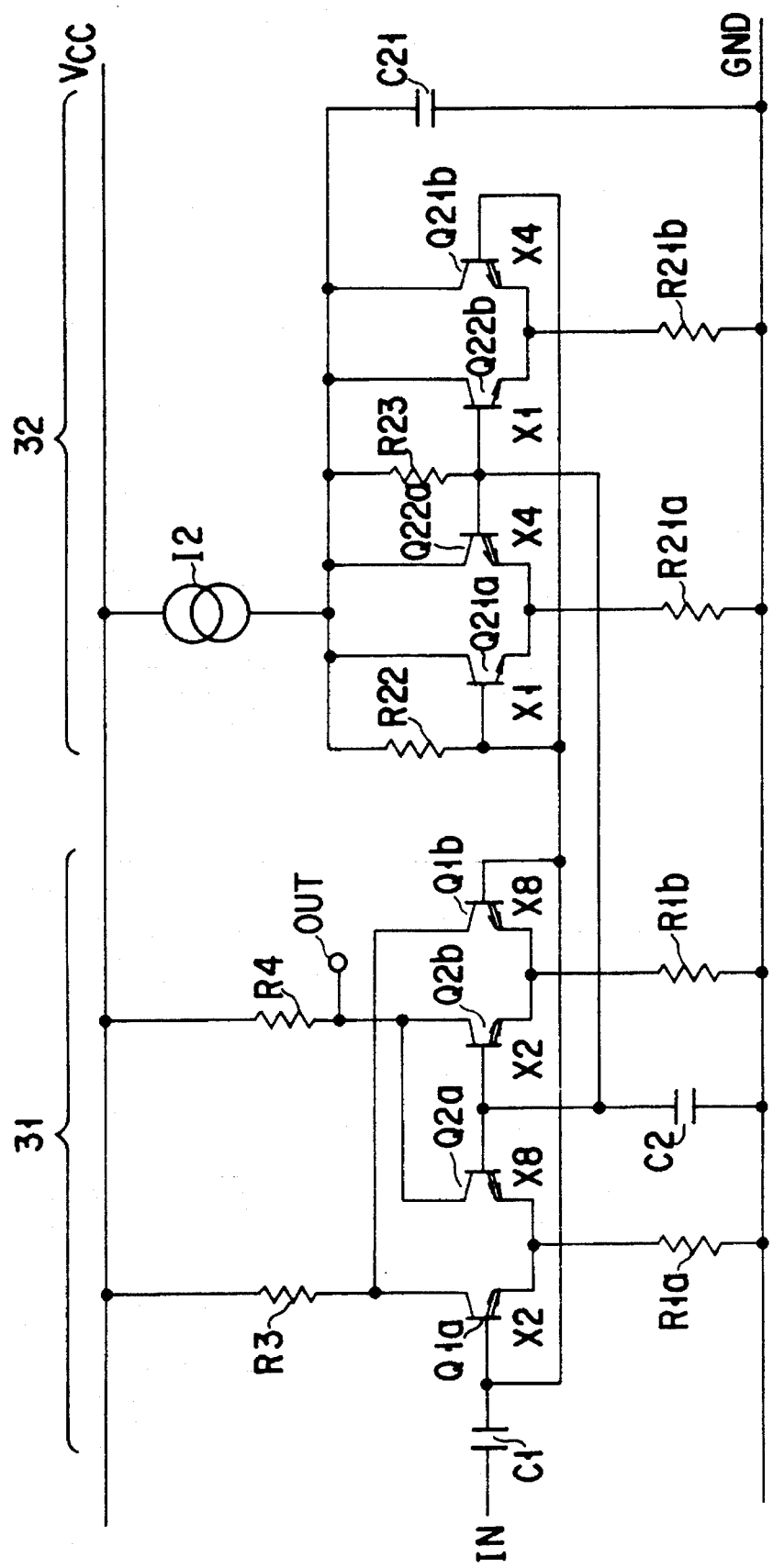
F I G. 5

5,488,330

BIAS CIRCUIT FOR CONTROLLING BIAS VOLTAGE OF DIFFERENTIAL AMPLIFIER

BACKGROUND OF THE INVENTION

1. Field of the Invention

The present invention relates to a bias circuit for a differential amplifier or a mixer circuit applied to an instrument processing a high frequency signal, such as a portable telephone.

2. Description of the Related Art

FIG. 6 shows a prior art differential amplifier 11. The amplifier 11 includes transistors Q1 to Q3, resistors R1 to R6, capacitors C1 and C2, and a constant-current source I1. The amount of current flowing through the transistors Q1 and Q2 depends upon the resistor R1. The transistors Q1 and Q2 are supplied with a bias voltage from a bias circuit constituted by the constant-current source I1, transistor Q3, and resistors R2, R5 and R6. When the level of an input signal IN supplied to the base of the transistor Q1 is low, a fixed amount of current flows through the differential amplifier 11. As the input signal IN increases in level, the current flowing through the amplifier 11 increases because of a nonlinear operation of the transistors Q1 and Q2. If the level of the input signal 11 increases further, the emitter potentials of the transistors Q1 and Q2 are clamped by the ground level, and the current flowing through the differential amplifier 11 increases abruptly.

FIG. 7 shows a prior art double-balance mixer circuit 12. The mixer circuit 12 includes transistors Q11 to Q17, resistors R11 to R16, capacitors C11 and C12, and a constant-current source I11. The transistors Q11 and Q12 constituting a first differential amplifier, serve as a stage supplied with an input signal IN. The emitters of the transistors Q14 and Q15, which constitute a second differential amplifier, are connected to the collector of the transistor Q11, and the emitters of the transistors Q16 and Q17, which constitute a third differential amplifier, are connected to the collector of the transistor Q12. The bases of the transistors Q14 to Q17 are supplied with a local oscillation signal LOC from a local oscillator (not shown). The transistors Q11 and Q12 are supplied with a bias voltage from a bias circuit constituted by the constant-current source Il1, transistor Q13, and resistors R12, R15 and R16. If the input signal IN increases in level, the current flowing through the mixer circuit 12 driven by the bias circuit increases, and the characteristic of the mixer circuit deteriorates, as in the case of the differential amplifier shown in FIG. 6.

For example, in portable telephones, when their antennas are put into contact with each other, a 10 dBm or more high-level signal is likely to enter at the antennas. This type of portable telephone is driven by a battery, and an integrated circuit incorporated into the telephone and having a differential amplifier or a mixer circuit is operated at a voltage of, for example, 2.2 V and 5.5 V. For this reason, when a high-level input signal of 2 $V_{p-p}$ or more is received, the transistors Q1 and Q2 shown in FIG. 6 and the transistors Q11 and Q12 shown in FIG. 7 are operated in a saturation region, and the S/N (signal-to-noise) ratio is easy to deteriorate. In the mixer circuit, when the transistors Q11 and Q12 are operated in the saturation region, the input signal is likely to leak toward the local oscillator.

If the resistor R1 of FIG. 6 and the resistor R11 of FIG. 7 are replaced with constant-current sources, an operation current can be prevented from increasing in the differential amplifier and mixer circuit even when a high-level signal is input to the differential amplifier and mixer circuit. In general, however, the noise generated from the constant-current source is greater than the noise generated from the resistor R1 or R11 and, if the resistors R1 and R11 are replaced with constant-current sources, the S/N ratio is degraded. In particular, a good S/N ratio is important to the mixer circuit, and it is unfavorable to replace the resistor R11 by a constant-current source.

An automatic gain control circuit, an attenuator circuit, a clamp circuit and the like can be utilized in order to prevent an operation current from increasing even when a high-level signal is input. These circuits are however complicated and, when they are inserted into a signal path, the S/N ratio deteriorates. Thus it is not advisable to employ the circuits.

SUMMARY OF THE INVENTION

An object of the present invention is to provide a bias circuit capable of preventing an operation current from increasing in transistors constituting a differential amplifier even when a high-level signal is input to the transistors.

To attain the above object, the present invention provides a bias circuit for controlling a base potential of first and second transistors constituting a first differential amplifier, comprising:

third and fourth transistors constituting a second differential amplifier and each having a current path one end of which is grounded via a resistor, the third transistor having a base connected to a base of the first transistor, and the fourth transistor having a base connected to a base of the second transistor;

a constant-current source connected between a power source and the other end of the current path of each of the third and fourth transistors, the constant-current source supplying a constant current to the third and fourth transistors; and a capacitor one end of which is connected to a connection node between the constant-current source and the other end of the current path of each of the third and fourth transistors, and the other end of which is grounded, the capacitor being discharged when a high-level signal is input to the bases of the first and third transistors, thereby to drop a base potential of the first and second transistors.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a circuit diagram showing a circuit according to a first embodiment of the present invention;

FIG. 2 is a circuit diagram showing a circuit according to a second embodiment of the present invention;

FIG. 3 is a circuit diagram showing a circuit according to a third embodiment of the present invention;

FIG. 4A is a characteristic diagram showing an operation of the circuit of FIG. 3;

FIG. 4B is a characteristic diagram showing an operation of the circuit of FIG. 1;

FIG. 5 is a circuit diagram showing a circuit according to a fourth embodiment of the present invention;

DETAILED DESCRIPTION OF THE PREFERRED EMBODIMENTS

Figure 6:
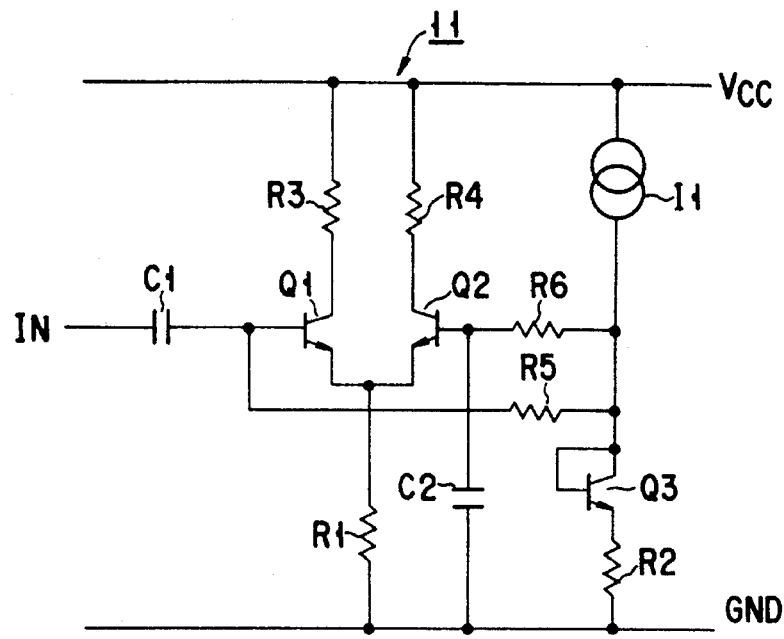
FIG. 6 is a circuit diagram showing a prior art differential amplifier.

FIG. 1 is a circuit diagram of a first embodiment of the present invention. In the first embodiment, the present invention is applied to a differential amplifier. In FIG. 1, the same components as those in FIG. 6 are denoted by the same reference numerals.

Referring to FIG. 1, the emitters of transistors Q1 and Q2 constituting a differential amplifier 11 are grounded via a resistor R1. The base of the transistor Q1 is supplied with an input signal IN through a capacitor C1, and the base of the transistor Q2 is grounded via a capacitor C2. The collectors of the transistors Q1 and Q2 are connected to a power source Vcc through resistors R3 an R4, respectively. The collector of the transistor Q2 is connected to an output terminal OUT.

In a bias circuit 21, the emitters of transistors Q21 and Q22 constituting a differential amplifier are grounded through a resistor R21. The base of the transistor Q21 is connected to that of the transistor Q1 and to the collector of the transistor Q21 via a resistor R22. The base of the transistor Q22 is connected to that of the transistor Q2 and to the collector of the transistor Q22 through a resistor R23. The collectors of the transistors Q21 and Q22 are grounded through a capacitor C21, and connected to the power source Vcc through a constant-current source I2.

In the foregoing circuit arrangement, the bases of the transistors Q1 and Q21 are supplied with the same signal, as are the bases of the transistors Q2 and Q22. The relationship in size among the transistors Q1, Q2, Q21 and Q22, e.g., the relationship in area of emitter among them is that Q1: Q21=Q2: Q22 (Q1≧Q21, Q2≧Q22). Consequently, the input signal versus operation current characteristics of the transistors Q1 and Q2 are almost equal to those of the transistors Q21 and Q22.

An operation of the circuit having the above arrangement will now be described. When the level of the input signal IN falls within a linear operation region of the transistors Q1 and Q2, the bias circuit 21 supplies a fixed bias voltage to the differential amplifier 11.

when the input signal IN is supplied to the base of the transistor Q1, the transistors Q1, Q2, Q21 and Q22 tend to increase the current flowing through the resistors R1 and R21 in the positive cycle of the input signal IN. If, however, the transistors Q21 and Q22 cause a current, which is larger than the current generated from the constant-current source I2, to flow through the resistor R21, the capacitor 21 is discharged. The collector potential of the transistors Q21 and Q22 drops, as does the base potential of the transistors Q21, Q22, Q1 and Q2. Therefore, the current flowing through the resistors R21 and R1 is decreased.

In the negative cycle of the input signal IN, the transistors Q1, Q2, Q21 and Q22 intend to reduce the current flowing through the resistors R1 and R21. When the current flowing through the resistor R21 becomes smaller than the current output from the constant-current source I2, the capacitor C21 is charged. Therefore, the collector potential of the transistors Q21 and Q22 rises. Since the base potential of the transistors Q21, Q22, Q1 and Q2 also rises, the current flowing through the resistors R21 and R1 increase.

According to the first embodiment, the base potential of the transistors Q1 and Q2 is controlled by the bias circuit 21. The base potential is smoothed by the capacitor 21 and finally stabilized at a predetermined value. Thus the operation current of the differential amplifier 11 can be kept constant even when the level of the input signal IN is high.

The resistor R1 need not be replaced with a constant-current source, by virtue of the bias circuit 21. Furthermore, since the bias circuit 21 does not influence a normal-level input signal, the S/N ratio can be prevented from deteriorating. The bias circuit 21 is suitable for an integrated circuit because it is simple in structure and has a small number of elements.

Figure 7:
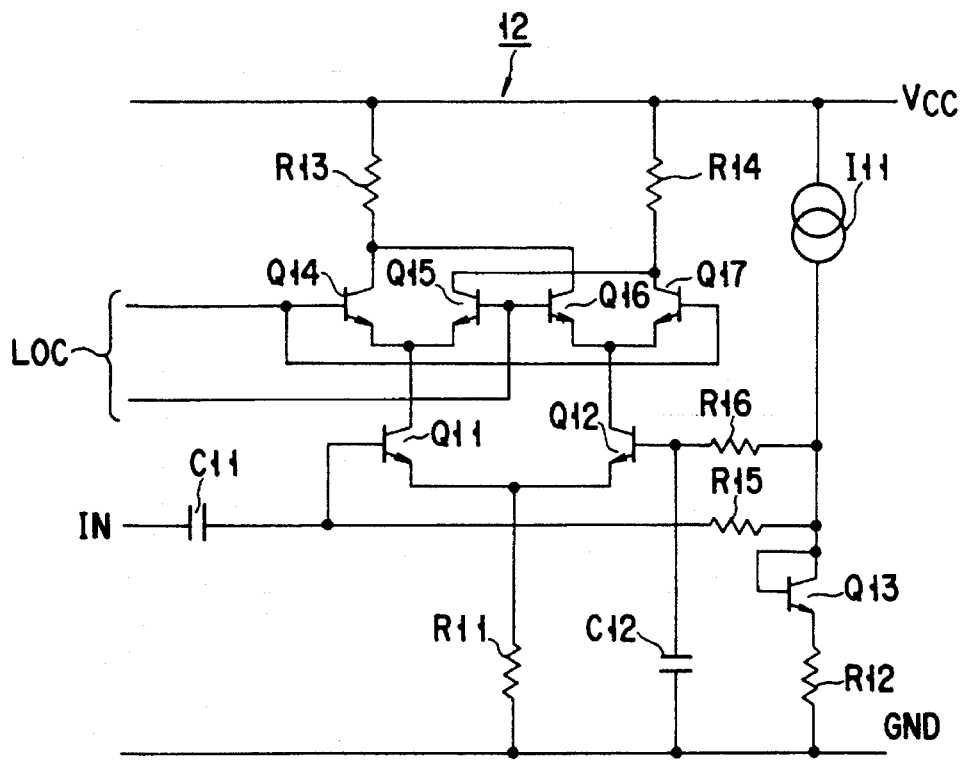
FIG. 7 is a circuit diagram showing a prior art double-balance mixer circuit.

FIG. 2 is a circuit diagram of a second embodiment of the present invention. In the second embodiment, the present invention is applied to a double-balance mixer circuit. In FIG. 2, the same constituents as those in FIGS. 7 and 1 are denoted by the same reference numerals.

In a double-balance mixer circuit 12 as illustrated in FIG. 2, the emitters of transistors Q11 and Q12 constituting a differential amplifier are grounded via a resistor R11. The base of the transistor Q11 is supplied with an input signal IN through a capacitor C11, and the base of the transistor Q12 is grounded via a capacitor C12.

The emitters of transistors Q14 and Q15 constituting a differential amplifier are connected to the collector of the transistor Q11. The bases of the transistors Q14 and Q15 are supplied with a local oscillation signal LOC from a local oscillator (not shown), and the collectors thereof are connected to a power source Vcc through resistors R13 and R14, respectively.

The emitters of transistors Q16 and Q17 constituting a differential amplifier are connected to the collector of the transistor Q12. The base of the transistor Q16 is connected to that of the transistor Q15, while the base of the transistor Q17 is connected to that of the transistor Q14. Thus the bases of the transistors Q16 and Q17 are supplied with the local oscillation signal LOC from the local oscillator. The collectors of these transistors Q16 and Q17 are connected to the power source Vcc through the resistors R13 and R14, respectively. The collector of the transistor Q17 is connected to an output terminal OUT.

The base of a transistor Q21 constituting a bias circuit 21 is connected to that of the transistor Q11 constituting the mixer circuit 12, and the base of a transistor Q22 also constituting the bias circuit 21 is connected to that of the transistor Q12 constituting the mixer circuit 12. The operation of the bias circuit 21 has been described above. The transistors Q11 and Q12 is more difficult to operate in a saturation region than those of the prior art circuit, and the transistors Q21 and Q22 operate in the saturation region earlier than the transistors Q11 and Q12 do.

In the second embodiment, the collector current flowing through the transistors Q11 and Q12 varies with the input signal supplied to the base of the transistor Q11, and the collector current flowing through the transistors Q14 to Q17 varies with both the local oscillation signal LOC supplied to the bases of the transistors Q14 to Q17 and the collector current of the transistors Q11 and Q12. The bias circuit 21 operates in the same manner as that of FIG. 1 does, and keeps the base potential of the transistors Q11 and Q12 of the mixer circuit 12 at a fixed value.

According to the second embodiment, since the bias circuit 21 is connected to the mixer circuit 12, a fixed amount of operation current of the mixer circuit 12 can be maintained even when a high-level signal IN is input to the mixer circuit 12. Therefore, the characteristics of the mixer circuit can be stabilized, irrespective of the level of the input signal. Furthermore, the S/N ratio can be prevented from deteriorating since the resistor R11 need not be replaced with a constant-current source.

FIG. 3 is a circuit diagram of a third embodiment of the present invention. In FIG. 3, the same constituents as those in FIG. 1 are indicated by the same reference numerals.

In a bias circuit shown in FIG. 3, capacitors C21a and C21b are connected to transistors Q21 and Q22, respectively, as are constant-current sources I2a and I2b. More specifically, the collector of the transistor Q21 is grounded via the capacitor C21a and connected to a power source Vcc via the constant-current source I2a, and the collector of the transistor Q22 is grounded via the capacitor C21b and connected to the power source Vcc via the constant-current source I2b. The currents of the sources I2a and I2b are set to be equal to each other.

In the circuit arrangement shown in FIG. 3, the transistors Q1 and Q21 serve as a current mirror, as do the transistors Q2 and Q22. Since the currents of the constant-current sources I2a and I2b are set to be equal, the averages of currents flowing through the transistors Q1 and Q2 are the same. In contrast, in the circuit shown in FIG. 1, the averages of currents flowing through the transistors Q1 and Q2 differ from each other.

The bias circuit 21 of the third embodiment operates in substantially the same manner as that of the first embodiment (FIG. 1) does. More specifically, when a high-level signal IN is input to a differential amplifier 11, the bias circuit 21 decreases the base current of the transistors Q1 and Q2 to stabilize the operation current of the differential amplifier 11. When the high-level input signal IN is supplied, the capacitors C21a and C21b are discharged in the positive cycle of the input signal IN and charged in the negative cycle thereof.

Figure 8:
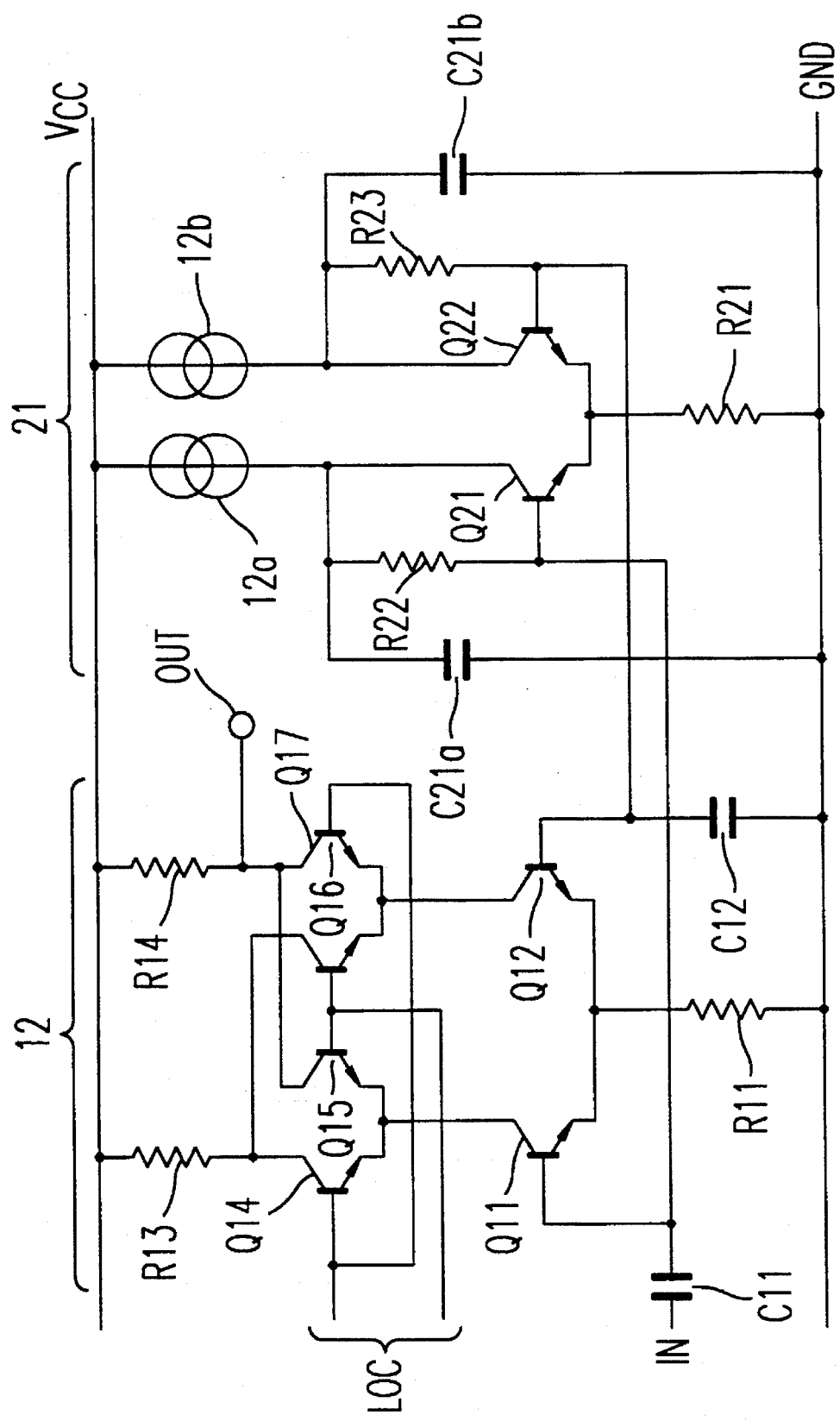
FIG. 8 is a circuit diagram showing a circuit according to a further embodiment of the present invention, in which the mixer of FIG. 2 is combined with the bias circuit of FIG. 3.

The bias circuit 21 of the second embodiment illustrated in FIG. 2 is interchangeable with that shown in the third embodiment illustrated in FIG. 3. FIG. 8 illustrates a further embodiment of the present invention in which the mixer of the left half of FIG. 2 is combined with the bias circuit of the right half of FIG. 3.

FIG. 4A shows a base voltage VB1 of transistor Q1 of the circuit shown in FIG. 3 and a base voltage VB2 of transistor Q2 thereof, and FIG. 4B shows a base voltage VB1 of transistor Q1 of the circuit shown in FIG. 1 and a base voltage VB2 of transistor Q2 thereof. In FIGS. 4A and 4B, Va represents a base voltage corresponding to a normal-level input signal IN, and Vb does a base voltage corresponding to a high-level input signal. In both the circuits shown in FIGS. 3 and 1, when the high-level input signal is supplied, the operation current can be prevented from increasing, by dropping the base voltage of the transistors Q1 and Q2.

FIG. 5 is a circuit diagram of a fourth embodiment of the present invention. In this embodiment, the present invention is applied to a differential amplifier which widens a dynamic range for an input signal and includes transistors of different sizes.

In a differential amplifier 31 shown in FIG. 5, the emitters of transistors Q1a and Q2a constituting a first differential amplifier are grounded via a resistor R1a. The base of the transistor Q1a is supplied with an input signal IN through a capacitor C1, and the base of the transistor Q2a is grounded via a capacitor C2. The collectors of these transistors Q1a and Q2a are connected to a power source Vcc through resistors R3 and R4, respectively.

The emitters of transistors Q1b and Q2b constituting a second differential amplifier are grounded via a resistor R1b. The base of the transistor Q1b is supplied with the input signal IN through the capacitor C1, and that of the transistor Q2b is grounded via the capacitor C2. The collectors of these transistors Q1b and Q2b are connected to the power source Vcc through resistors R3 and R4, respectively.

In a bias circuit 32 shown in FIG. 5, the emitters of transistors Q21a and Q22a constituting a third differential amplifier are grounded via a resistor R21a. The base of the transistor Q21a is connected to that of the transistor Q1a and to the collector of the transistor Q21a through a resistor R22. The base of the transistor Q22a is connected to the bases of the transistors Q2a and Q2b, and to the collector of the transistor Q22a through a resistor R23. The collectors of the transistors Q21a and Q22a are grounded via a capacitor C21 and to the power source Vcc via a constant-current source I2.

The emitters of transistors Q21b and Q22b constituting a fourth differential amplifier are grounded via a resistor R21b. The base of the transistor Q21b is connected to that of the transistor Q1a, and the base of the transistor Q22b is connected to that of the transistor Q22a. The collectors of these transistors Q21b and Q22b are grounded via the capacitor C21 and connected to the power source Vcc through the constant-current source I2.

While the area of each emitter of the transistors Q1a and Q2b is twice as large as that of each emitter of the transistors Q21a and Q22b, the area of each emitter of the transistors Q22a and Q21b is four times as large as that of each emitter of the transistors Q21a and Q22b. Furthermore, the area of each emitter of the transistors Q2a and Q1b is eight times as large as that of each emitter of the transistors Q21a and Q22b.

The bias circuit 31 of the fourth embodiment operates in substantially the same manner as that of the first embodiment does. When a high-level signal is input to the base of the transistor Q1a, the capacitor C21 is discharged in accordance with the operations of the third and fourth differential amplifiers to drop the base potential of the transistors Q1a and Q1b, thereby preventing the operation current from increasing.

The capacitor C2 is ground in the first, third and fourth embodiments described above. The present invention is not limited to this, but the input signal IN can be supplied to the bases of the transistors Q1, Q2, Q1a and Q2a through the capacitors C2 and C1. In the second embodiment, too, the input signal IN can be supplied to the bases of the transistors Q11 and Q12 through the capacitors C11 and C22.

What is claimed is:

1. A bias circuit of a differential amplifier, comprising:

first and second transistors constituting a first differential amplifier and each having a current path one end of which is grounded via a resistor and another end of which is connected to a power source, said first transistor having a base supplied with an input signal;

third and fourth transistors constituting a second differential amplifier and each having a current path one end of which is grounded via a resistor, said third transistor having a base connected to the base of said first transistor, and said fourth transistor having a base connected to a base of said second transistor;

a constant-current source connected between said power source and another end of the current path of each of said third and fourth transistors, said constant-current source supplying a constant current to said third and fourth transistors; and a capacitor one end of which is connected to a connection node between said constant-current source and said another end of the current path of each of said third and fourth transistors, and another end of which is grounded, said capacitor being discharged when a high-level signal is input to the bases of said first and third transistors, thereby to drop a base potential of said first and second transistors.

2. A circuit according to claim 1, wherein said constant-current source includes first and second constant-current sources, and said capacitor includes first and second capacitors, said first constant-current source and said first capacitor being connected to said third transistor constituting the second differential amplifier, and said second constant-current source and said second capacitor being connected to said fourth transistor constituting the second differential amplifier.

3. A circuit according to claim 1, wherein a size of each of said first and second transistors is set to be an integral multiple of a size of each of said third and fourth transistors.

4. A bias circuit for controlling a potential at bases of first and second transistors constituting a first differential amplifier, comprising:

third and fourth transistors constituting a second differential amplifier and each having a current path one end of which is grounded via a resistor, said third transistor having a base connected to the base of said first transistor, and said fourth transistor having a base connected to the base of said second transistor;

a constant-current source connected between a power source and another end of the current path of each of said third and fourth transistors, said constant-current source supplying a constant current to said third and fourth transistors; and a capacitor one end of which is connected to a connection node between said constant-current source and said another end of the current path of each of said third and fourth transistors, and another end of which is grounded, said capacitor being discharged when a high-level signal is input to the bases of said first and third transistors, thereby to drop a base potential of said first and second transistors.

5. A circuit according to claim 4, further comprising:

a third differential amplifier connected to a collector of said first transistor constituting the first differential amplifier; and a fourth differential amplifier connected to a collector of said second transistor constituting the first differential amplifier, said third and fourth differential amplifiers being supplied with a local oscillation signal, and said local oscillation signal being mixed with an input signal supplied to the first differential amplifier.

6. A circuit according to claim 4, wherein said constant-current source includes first and second constant-current sources, and said capacitor includes first and second capacitors, said first constant-current source and said first capacitor being connected to said third transistor constituting the second differential amplifier, and said second constant-current source and said second capacitor being connected to said fourth transistor constituting the second differential amplifier.

7. A circuit according to claim 4, wherein a size of each of said first and second transistors is set to be an integral multiple of a size of each of said third and fourth transistors.

8. A bias circuit of a mixer circuit, comprising:

first and second transistors constituting a first differential amplifier and each having a current path one end of which is grounded via a resistor, said first transistor having a base supplied with an input signal;

third and fourth transistors constituting a second differential amplifier and each having a current path one end of which is connected to another end of the current path of said first transistor and another end of which is connected to a power source, said third and fourth transistors each having a base supplied with a local oscillation signal;

fifth and sixth transistors constituting a third differential amplifier and each having a current path one end of which is connected to another end of the current path of said second transistor and another end of which is connected to the power source, said fifth and sixth transistors each having a base supplied with a local oscillation signal;

seventh and eighth transistors constituting a fourth differential amplifier and each having a current path one end of which is grounded via a resistor, said seventh transistor having a base connected to the base of said first transistor, and said eighth transistor having a base connected to a base of said second transistor;

a constant-current source connected between the power source and another end of the current path of each of said seventh and eighth transistors, said constant-current source supplying a constant current to said seventh and eighth transistors; and a capacitor one end of which is connected to a connection node between said constant-current source and said another end of the current path of each of said seventh and eighth transistors, and another end of which is grounded, said capacitor being discharged when a high-level signal is input to the base of said first transistor, thereby to drop a base potential of said first and second transistors.

9. A circuit according to claim 8, wherein said constant-current source includes first and second constant-current sources, and said capacitor includes first and second capacitors, said first constant-current source and said first capacitor being connected to said seventh transistor constituting the fourth differential amplifier, and said second constant-current source and said second capacitor being connected to said eighth transistor constituting the fourth differential amplifier.

10. A bias circuit of a mixer circuit which includes first and second transistors constituting a first differential amplifier and each having a base supplied with an input signal, third and fourth transistors constituting a second differential amplifier and each having a base supplied with a local oscillation signal, and fifth and sixth transistors constituting a third differential amplifier and each having a base supplied with a local oscillation signal, and which mixes an output signal of the first differential amplifier and output signals of the second and third differential amplifiers, comprising:

seventh and eighth transistors constituting a fourth differential amplifier and each having a current path one end of which is grounded via a resistor, said seventh transistor having a base connected to the base of said first transistor, and said eighth transistor having a base connected to the base of said second transistor;

a constant-current source connected between a power source and another end of the current path of each of said seventh and eighth transistors, said constant-current source supplying a constant current to said seventh and eighth transistors; and a capacitor one end of which is connected to a connection node between said constant-current source and said another end of the current path of each of said seventh and eighth transistors, and another end of which is grounded, said capacitor being discharged when a high-level signal is input to the base of said first transistor, thereby to drop a base potential of said first and second transistors.

11. A bias circuit for controlling a potential at bases of first and second transistors constituting a first differential amplifier, comprising:

third and fourth transistors constituting a second differential amplifier and each having a current path one end of which is grounded via a resistor, said third transistor having a base connected to the base of said first transistor and said fourth transistor having a base connected to the base of said second transistor;

first and second constant-current sources each connected between a power source and another end of the current path of each of said third and fourth transistors, said first and second constant-current sources supplying a constant current to said third and fourth transistors;

a first capacitor one end of which is connected to a connection node between said first constant-current source and said another end of the current path of said third transistor, and another end of which is grounded; and a second capacitor one end of which is connected to a connection node between said second constant-current source and said another end of the current path of said fourth transistor, and another end of which is grounded, said first and second capacitors being discharged when a high-level signal is input to the base of said first transistor, thereby to drop a base potential of said first and second transistors.

12. A bias circuit comprising:

first and second transistors constituting a first differential amplifier and each having a current path one end of which is grounded and another end of which is connected to a power source, said first transistor having a base supplied with an input signal;

third and fourth transistors constituting a second differential amplifier and each having a current path one end of which is grounded and another end of which is connected to the power source, said third transistor having a base connected to a base of said second transistor, and said fourth transistor having a base supplied with an input signal;

fifth and sixth transistors constituting a third differential amplifier and each having a current path one end of which is grounded via a resistor, said fifth transistor having a base connected to the base of said first transistor, and said sixth transistor having a base connected to the base of said second transistor;

seventh and eighth transistors constituting a fourth differential amplifier and each having a current path one end of which is grounded via a resistor, said seventh transistor having a base connected to the base of said second transistor, and said eighth transistor having a base connected to the base of said first transistor;

a constant-current source connected between said power source and another end of the current path of each of said fifth, sixth, seventh and eighth transistors, said constant-current source supplying a constant current to said fifth, sixth, seventh and eighth transistors; and a capacitor one end of which is connected to a connection node between said constant-current source and said another end of the current path of each of said fifth, sixth, seventh and eighth transistors, and another end of which is grounded, said capacitor being discharged when a high-level signal is input to the bases of said first and fourth transistors, thereby to drop a base potential of said first and fourth transistors.

13. A circuit according to claim 12, wherein an area of an emitter of each of said first, second, third and fourth transistors is set to be an integral multiple of an area of an emitter of each of said fifth, sixth, seventh and eighth transistors.

14. A circuit according to claim 6, further comprising:

a first resistor connected between a base of said third transistor and said another end of the current path of said third transistor; and a second resistor connected between a base of said fourth transistor and said another end of the current path of said fourth transistor.

15. A circuit according to claim 11, further comprising:

a first resistor connected between a base of said third transistor and said another end of the current path of said third transistor; and a second resistor connected between a base of said fourth transistor and said another end of the current path of said fourth transistor.

* * * * *